(12) United States Patent  
Rudiger

(10) Patent No.: US 6,615,993 B1  
(45) Date of Patent: Sep. 9, 2003

(54) SLIDE INTERLOCK ASSEMBLY FOR A RACK

(75) Inventor: Wolfram A. Rudiger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/116,419

(22) Filed: Apr. 3, 2002

(51) Int. Cl.⁷ .................................................. A47F 5/00
(52) U.S. Cl. .......................... 211/26; 211/175; 361/683; 312/223.2; 312/265.1; 312/218; 312/221
(58) Field of Search ................ 211/26, 175; 312/223.2, 312/265.1, 265.4, 334.7, 334.8, 216, 217, 218, 219, 220, 221; 361/683

(56) References Cited

U.S. PATENT DOCUMENTS 5,333,949 A * 8/1994 McGregor .................. 312/221
5,427,445 A * 6/1995 Mitchell ..................... 312/221
5,605,388 A * 2/1997 Laakso ................... 312/221 X
5,772,294 A * 6/1998 Hendrich et al. ........... 312/221
6,021,909 A    2/2000 Tang et al. ................. 211/183
6,209,979 B1 * 4/2001 Fall et al.
6,230,903 B1   5/2001 Abbott ........................ 211/26
6,238,024 B1   5/2001 Sawatzky ................... 312/221
6,554,142 B2 * 4/2003 Gray ........................... 211/26

* cited by examiner

Primary Examiner—Robert W. Gibson, Jr.

(57) ABSTRACT

A slide interlock assembly for a rack including a first rod, a first mount bracket secured to a first stationary member of the rack and having a first guide for receiving one end of the rod, a second mount bracket, secured to a second stationary member of the rack and having a second guide for receiving a second end of the first rod, a first actuator bracket secured to a first slide member adjacent the first mount bracket, having a surface that is inclined relative to a sliding axis of the first slide member for engaging a first end of the first rod, and a second actuator bracket, secured to a second slide member, having a hole for receiving a second end of the first rod when the first slide member is extended.

25 Claims, 4 Drawing Sheets

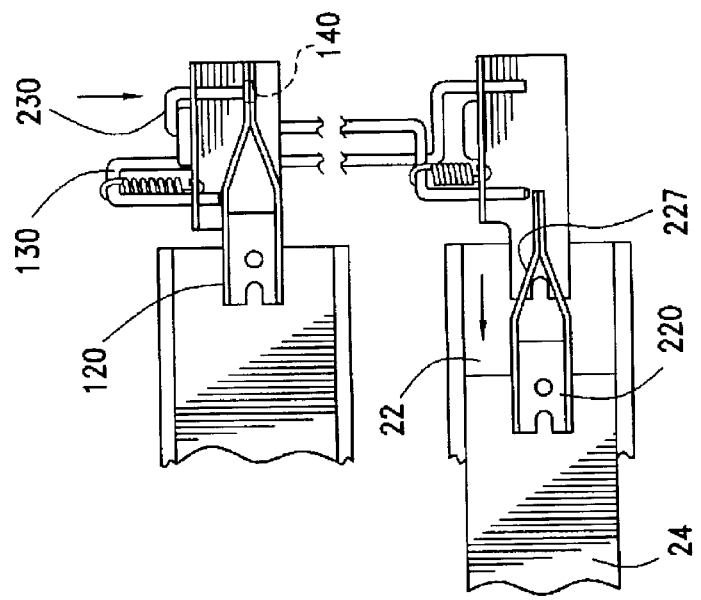
FIG. 6
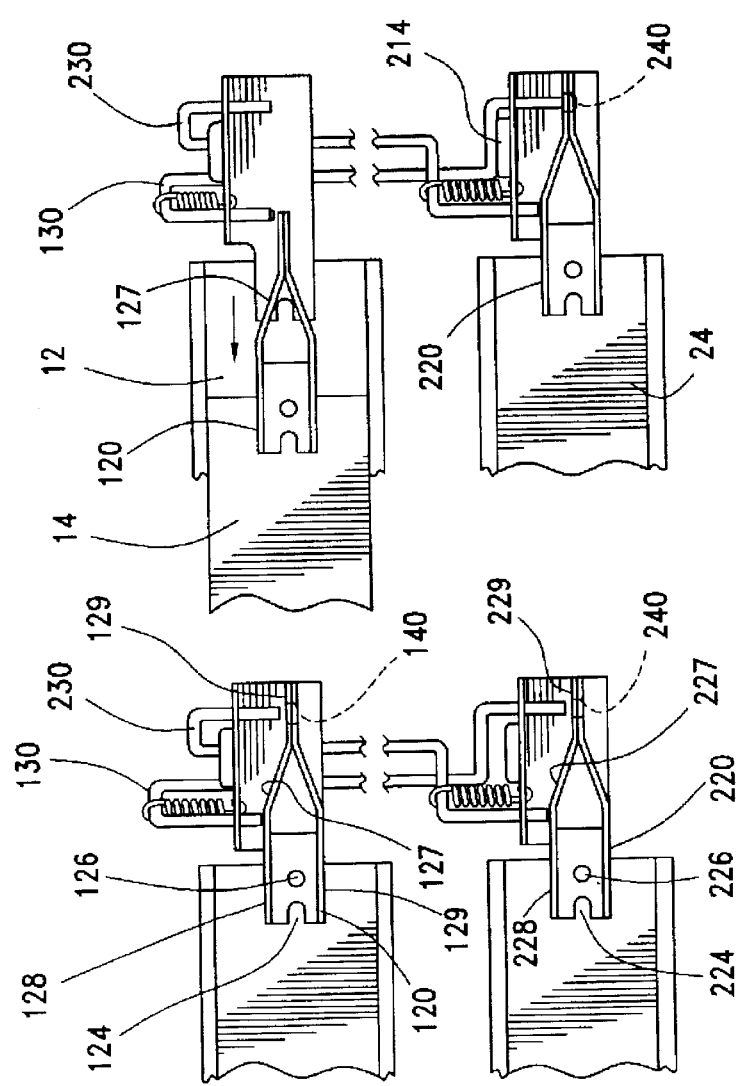
FIG. 5
FIG. 4

SLIDE INTERLOCK ASSEMBLY FOR A RACK

TECHNICAL FIELD

The subject matter disclosed here generally relates to racks, and more particularly, to an interlock assembly for slide members in a rack.

BACKGROUND

A "rack" is a frame or cabinet for holding other equipment, such as servers and/or other electronic components. Various "rackmount" kits are available from Hewlett-Packard in order to provide support members (including, but not limited to, rails and slides) for mounting various components inside racks. For example, U.S. Pat. No. 6,021,909 to Tang et al. (and assigned at issuance to Hewlett-Packard Company) discloses a rail system for use in an equipment enclosure and is incorporated by reference here. Similarly, U.S. Pat. No. 6,230,903 to Abbot (also assigned at issuance to Hewlett-Packard Company) discloses a rack slide mounting system and is also incorporated by reference here.

A common problem with racks that have these, and other sliding mechanisms, is the tendency of the rack to tip if slides at different levels are extended, or otherwise opened, at the same time. Manufacturers of multi-drawer filing cabinets have addressed similar problems by providing interlock mechanisms that prevent the opening of more than one drawer at a time. Once one file cabinet drawer is opened, the remainder of the drawers are locked until the first drawer has been returned to a closed, unlocked position.

For example, U.S. Pat. No. 6,238,024 to Sawatzky (assigned at issuance to Waterloo Furniture Components Ltd.), is incorporated by reference here and discloses a linkage member for an anti-tip/interlock device with an actuator cam that is rotatably mounted on a slide bracket. A plurality of connecting rods extend vertically between the drawers and a separate cam follower is attached to the end of each rod. The cam followers cooperate with the activating cam and drive the connecting rods between locking and unlocking positions. However, such devices are complicated and difficult to assemble.

SUMMARY

These and other drawbacks of conventional approaches are addressed here by providing a slide interlock assembly for a rack including a first actuator bracket for securing to a first slide member of the rack; a second actuator bracket for securing to a second slide member of the rack; a first locking member for extending between the first actuator bracket and the second actuator bracket; a second locking member for extending between the first actuator bracket and the second actuator bracket; and where each actuator bracket has a two-step surface with opposite ends of the locking members engaging opposite steps on each actuator bracket.

Also provided is a slide interlock assembly for a rack having a first rod; a first mount bracket secured to a first stationary member of the rack and having a first guide for receiving one end of the rod; a second mount bracket secured to a second stationary member of the rack and having a second guide for receiving a second end of the first rod; a first actuator bracket secured to a first slide member of the adjacent the first stationary member and having a surface that is inclined relative to a sliding axis of the first slide member for engaging a first end of the first rod; and a second actuator bracket, secured to a second slide member, having a hole for receiving a second end of the first rod when the first slide member is extended.

Also provided is a rack including first and second stationary members; first and second slide members arranged adjacent to the first and second stationary members, respectively; a first rod and a second rod extending between the first and second slide members; first means, secured to the first slide member, for moving the first rod upon retraction of the first slide member and for locking with the second rod upon extension of the second slide member; and second means, secured to the second slide member, for moving the second rod upon retraction of the second slide member and for locking with the first rod upon extension of the first slide member.

BRIEF DESCRIPTION OF THE DRAWINGS

Various aspects of the invention will now be described with reference to the following figures ("FIGS.") which are not necessarily drawn to scale, but use the same reference numerals to designate corresponding parts throughout each of the several views.

FIG. 4 is a side elevation view of the slide interlock assembly shown in FIG. 2.

FIG. 5 is a side elevation view of the slide interlock assembly shown in FIG. 4 with the actuator bracket in an extended position.

FIG. 6 is a side elevation view of the slide interlock assembly shown in FIG. 4 with a second actuator bracket in an extended position.

DETAILED DESCRIPTION OF THE PREFERRED EMBODIMENTS

Figure 1:
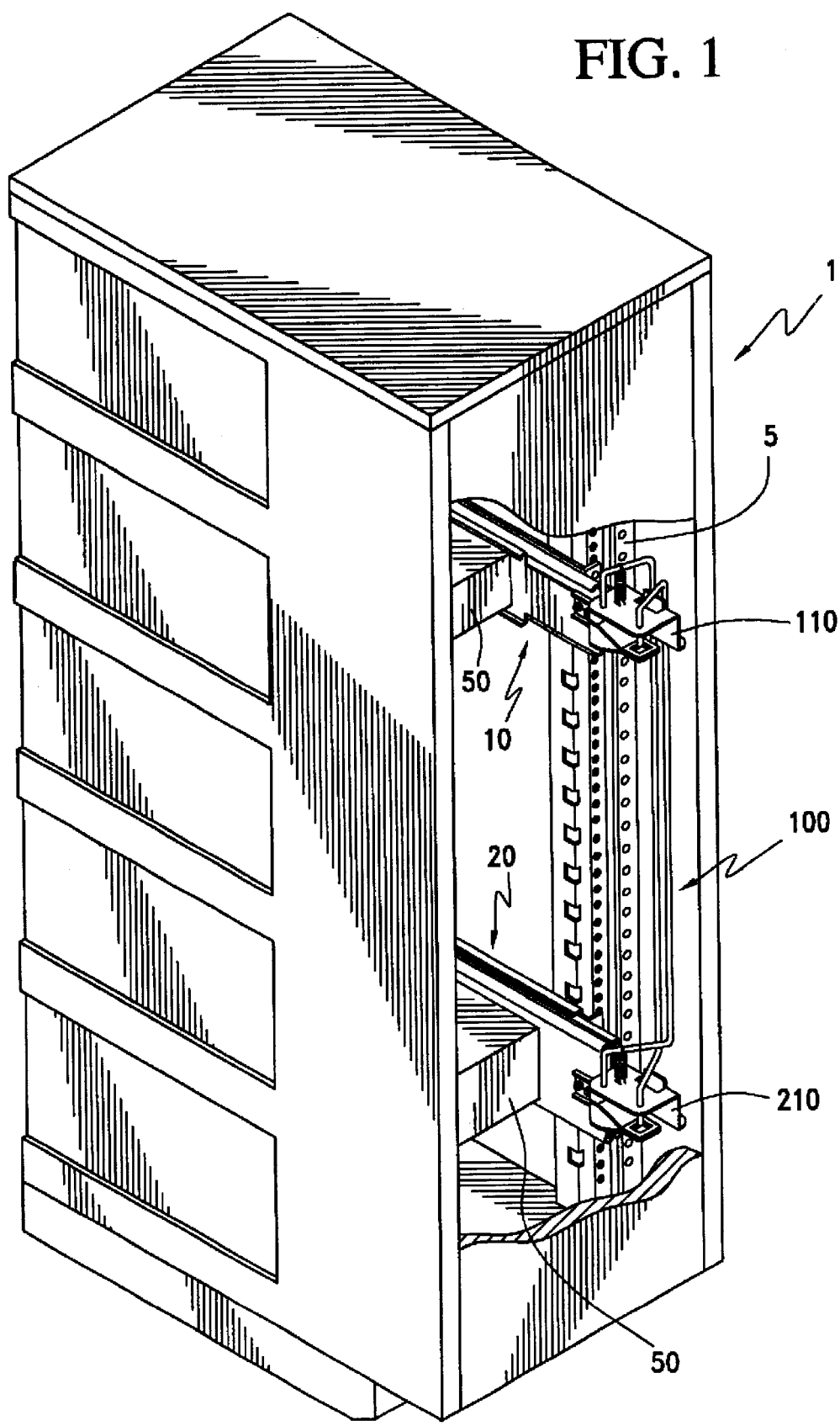
FIG. 1 a rear isometric view of a rack including one embodiment of a slide interlock assembly.

FIG. 1 illustrates a rack 1 including one embodiment of a slide interlock assembly 100 that is shown in more detail in FIGS. 2–6. The term "assembly" is used here to refer to a group of assembled or unassembled component parts that are configurable into a device such as the one shown in FIGS. 2–6. This term also refers to a process for configuring various parts into the assembled device that is generally referred to as a "slide interlock" because it connects together two or more slides so that they affect each other in motion and/or operation.

In FIG. 1, the rear panel of the rack 1 is cutaway to expose the slide interlock assembly 100 that is secured to a column 5 and a first, or upper, (top) slide assembly 10 and a second, or lower (bottom) slide assembly 20 that are discussed in more detail below. The terms "first," "second," "upper," "lower," "top," and "bottom," are used here in a strictly nominal manner in order to aid in an understanding of the drawings. These terms should also not be misconstrued in an ordinal manner to refer to time, order, rank, or importance. Similarly, these terms should not be misconstrued in a spatial manner in order to refer to a particular layout, geometry, or other inappropriate relational context.

As is well known in the art, each of the slide assemblies 10, 20 will typically include a moveable member secured to one of the components 50 and a fixed member secured to the column 5 for receiving and guiding the moveable slide member. A variety of conventional slide assemblies and/or components may be used in this regard. Although not shown in the drawings, a corresponding column will typically support other upper and lower slide assemblies on the other sides of each of the components 50. In this way, the slide interlock assembly 100 described here may be implemented in connection with the slide assemblies 10, 20 on one, or both, sides of the components 50. The slide interlock assembly 100 described below prevents, or otherwise hampers, two of the components 50 from being slid out of the rack 1 at the same time and possibly tipping the rack onto its front side.

Figure 2:
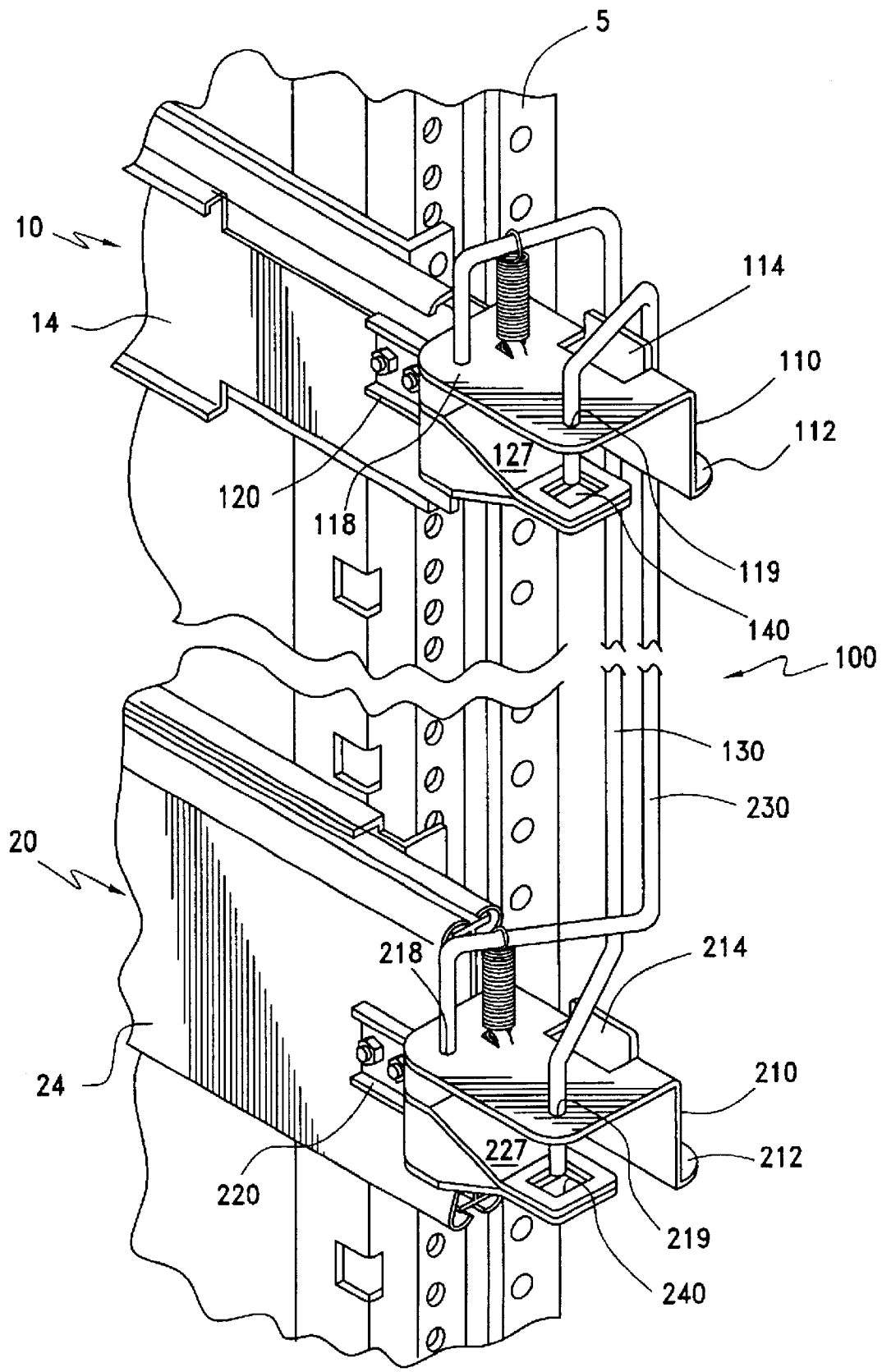
FIG. 2 an enlarged isometric view of the slide interlock assembly shown in FIG. 1.
Figure 3:
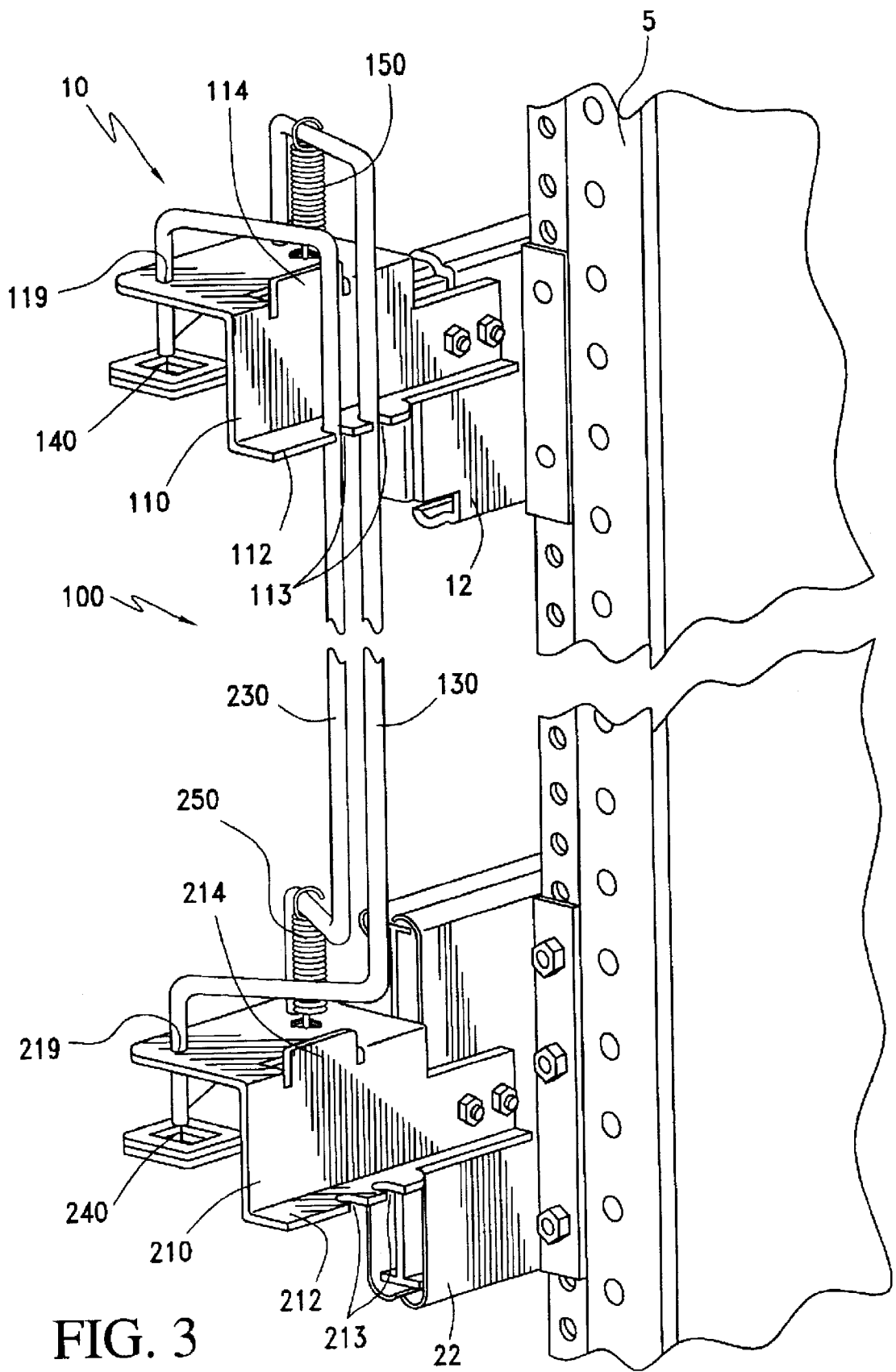
FIG. 3 is left isometric view of the slide interlock assembly shown in FIG. 2.

Turning to FIGS. 2 and 3, the slide interlock assembly 100 includes a first (upper) mount bracket 110 and a second (lower) mount bracket 210.

Although the two mount brackets 110, 210 are illustrated in the drawings with substantially the same features, a different number of actuator brackets, and/or actuator brackets having different features, may also be provided.

As best shown in FIG. 3, the first mount bracket 110 is secured to a first stationary support member 12 while the second mount bracket 210 is secured to a second stationary support member 22. For example, the first mount bracket 110 and the second mount bracket 210 may be secured to their respective first and second stationary members 12, 22 by a variety of fastening and/or joining techniques including the use of screws, bolts, rivets, adhesives, solder, and/or welding. Alternatively, the first mount bracket 110 and/or second mount bracket 210 may also be secured directly to the column or other stationary portions of the rack 1.

One, or both, of the first and second mount brackets 110, 210 may be optionally provided with corresponding shoulders 112, 212 and/or abutment tabs 114, 214, respectively, as described in more detail below. The shoulders 112, 212 on the first and/or second mount brackets 110, 220 may also be provided with optional guide slots 113 and 213, respectively. Various features of the first mount bracket 110 and/or the second mount bracket 210 may also be provided integral with the column 5, or integral with the corresponding first stationary member 12 and second stationary member 22.

The slide interlock assembly 100 is further provided with a first (top) actuator bracket 120 and a second (bottom) actuator bracket 220. Although the two actuator brackets 120, 220 are illustrated in the drawings with substantially the same features, actuator brackets having different features, may also be provided. As best shown in FIG. 2, the first actuator bracket 120 is secured to a first slide member 14. Similarly, the second actuator bracket 220 is secured to the second slide member 24. Alternatively, the first and second actuator brackets 120, 220 may be formed integral with the slide members 14, 24, integral with the components 50, or secured directly to the components 50.

As best shown in FIGS. 4–6, the first actuator bracket 120 is provided with a slot 124 for use in horizontally positioning the first actuator bracket against a pin or fastener (not shown in FIGS. 4–6). Also provided is a hole 126 for securing the first actuator bracket 120 to the first slide member 14 with a bolt (not numbered in FIGS. 2 and 3) or other fastener, such as a screw, clip, or pin. However, a variety of fastening and/or joining techniques may also be used for securing the first actuator bracket 120 to the first slide member 14. In a similar manner, the second actuator bracket 220 is also provided with a slot 224 and hole 226 for aligning and securing to the second slide member 24.

Each of the actuator brackets 120 and 220 is illustrated as having a surface 127, 227 that is inclined relative to the sliding axis of the corresponding slide member 14, 24 to which it is attached. Each of the actuator brackets 120, 220 may also include additional surfaces which are preferably arranged substantially parallel to the sliding axis of the corresponding slide member at each end of the inclined surfaces 127, 227. For example, as best shown in FIG. 4, a first (top) parallel step 128 is connected to the upper end of the inclined surface 127 while a second parallel (bottom) step 129 is arranged at a lower end of the inclined surface 127. Similarly, the second actuator bracket 220 is also provided with first (top) and second (bottom) parallel steps 228 and 229, respectively.

The slide interlock assembly 100 is further provided with a first locking member 130 and a second locking member 230. The locking members 130, 230 are illustrated here in the form of cylindrical, metal rods having a preferred diameter of 5 mm. However, a variety of other sizes, materials, and shapes may also be used including, but not limited to, plastic rods, polygonal rods and/or flat strips.

In the particular configuration shown in the drawings, each of the first and second locking rods 130 and 230 has substantially the same characteristic shape. In addition, the first locking rod 130 is longer than the second locking rod 230. However, it should be noted that this difference in length may be reversed and/or the position and configuration of the rods may be modified in order to suit a particular configuration of the rack 1.

Each of the first and second mount brackets 110, 210 includes guide holes 118, 119 and 218, 219, respectively, for receiving the ends of the locking rods 130 and 230. More specifically, the first guide hole 118 in the first mount bracket 110 receives a first end (top) of the first locking rod 130. Similarly, the second guide hole 119 in the first mount bracket 110 receives a first (top) end of the second locking rod 230. For the second mount bracket 210, the first guide hole 218 and the second mount bracket 210 receives a second (bottom) end of the second locking rod 230 while a second guide hole 219 receives a second (bottom) end of the first locking rod 130.

As noted above, the first and second actuator brackets 120, 220 each have a surface with two steps 128, 129 and 228, 229, respectively, where opposite ends of the locking rods 130, 230 engage opposite steps on each of the actuator brackets. In addition, each of the second (bottom) steps 129, 229 includes a corresponding locking hole 140, 240 (FIGS. 2 and 3) for receiving one end of one of the rods when the opposite actuator bracket is in an extended position. Once inside a locking hole 140, 240, the corresponding locking rod 130, 230 prevents the locked slide members 14, 24 from being extended, and possibly tipping the rack 1.

More specifically, when the first (top) actuator bracket 120 is in the extended position shown in FIG. 5, the second (bottom) end of the first locking rod 130 is engaged with the locking hole 240 on the second (bottom) actuator bracket 220. Similarly, as shown in FIG. 6, when the second (bottom) actuator bracket 220 is in the extended position, the first (top) end of the second locking rod 230 is engaged with the hole 140 on the first (top) actuator bracket 120. Otherwise, as shown in FIG. 4, when both the first actuator bracket 120 and the second actuator bracket 220 are in the retracted position, neither locking rod is engaged in the locking holes 140 or 240.

Each of the first and second locking rods 130, 230 is urged into the corresponding locking holes 140, 240 by gravity and/or optional tensions springs 150, 250. The first (upper) tension spring 150 is connected between the first locking rod 130 and the first mount bracket 110. Similarly, the second (lower) tension spring 250 is connected between the second locking rod 230 and the second mount bracket 210. The first and second tension springs 150 and 250 may also be connected to other stationary portions of the rack 1, such as the column 5. Alternatively, other types of biasing may be used for urging the rods 130, 230 into engagement with the holes 140, 240, such as compression springs, leaf springs, magnets, and/or electromagnetic actuators.

Operation of the slide interlock assembly 100 typically begins with all components 50 fully retracted into the rack 1 as shown in FIGS. 1–4. In this initial configuration, both the second (bottom) end of the first locking rod 130 and the first (top) end of the second locking rod 230 are withdrawn from their corresponding locking holes 240 and 140. In this configuration either the (top) first slide member 14 or the (bottom) second slide member 22 may be extended toward the positions illustrated in FIGS. 5 and 6, as discussed below.

Moving on to FIG. 5, as the (top) component 50 is extended from the front of the rack 1, the first (top) slide member 14 and first (top) actuator bracket 120 are extended until the inclined surface 127 engages the first (top) end of the first locking rod 130. The first tension spring 150 then urges the first (top) end of the first locking rod 130 (downward) against the inclined surface 127 until the second (bottom) end of the first rod 130 is inserted into the (bottom) locking hole 240 in the second (bottom) actuator bracket 220, as shown in FIG. 5.

In FIG. 5, the second locking rod 230 is engaged with the locking hole 230 and also abuts against the abutment tab 214. The (bottom) second slide member 22 and (bottom) component 50 are thus prevented from being extended and possibly tipping the rack 1 when the first (top) slide member 14 is extended member 24 is extended.

When the first (top) slide member 14 and (top) component 50 is returned to its retracted position, the first (top) end of the first locking rod 130 will once again engage the inclined surface 127. The first (top) actuator bracket 120 will then be pushed upward against the force of the first (top) tension spring 150 until the second (bottom) end of the first locking rod 130 is removed from the hole 240 in the second (bottom) actuator bracket 220 and the first (top) end of the locking rod 130 comes to rest against the first (top) step 128 on the first (top) actuator bracket 120.

Turning to FIG. 6, as the (bottom) component 50 is extended from the front of the rack 1, the second (bottom) slide member 24 and second (bottom) actuator bracket 220 are extended until the inclined surface 227 engages the second (bottom) end of the second locking rod 230. The second tension spring 250 then urges the second (bottom) end of the second locking rod 230 (downward) against the inclined surface 227 until the first (top) end of the second rod 230 is inserted into the locking hole 140 in the first (top) actuator bracket 220, as shown in FIG. 6. The other (top) component 50 and first (top) slide member 14 are thus prevented from being extended and possibly tipping the rack 1.

In FIG. 6, the second locking rod 230 is engaged with the locking hole 230 and also abuts against the abutment tab 214. The (bottom) second slide member 22 and (bottom) component 50 are thus prevented from being extended and possibly tipping the rack 1 when the first (top) slide member 14 is extended. member 24 is extended.

Then, upon returning to the fully retracted configuration shown in FIG. 4, where both the first actuator bracket 120 and second actuator bracket 220 have both been retracted, both the second end of the first locking rod 130 and the first end of the second locking rod 230 will have been withdrawn from their corresponding locking holes 240 and 140. In that configuration, the first end of the first rod 130 will rest against the first (top) step 128 on the first (top) actuator bracket while the second (bottom) end of the second rod 230 will rest against the corresponding first step 228 on the second actuator bracket 220.

Consequently, the interlock assembly 100 will be in a stable configuration when both actuator brackets 120, 220 are fully retracted as shown in FIG. 4.

Additional pairs of components 50 (not show) secured to other upper and lower slide members (not shown) may also be interlocked in similar fashion.

It should be emphasized that the embodiments described above, and particularly any "preferred" embodiments, are merely examples of various implementations that have been set forth here to provide a clear understanding of various aspects of the invention. One of ordinary skill will be able to alter many of these embodiments without substantially departing from scope of protection defined solely by the proper construction of the following claims.

What is claimed is:

1. A slide interlock assembly for a rack, comprising:
   a first actuator bracket for securing to a first slide member of the rack;
   a second actuator bracket for securing to a second slide member of the rack;
   a first locking member for extending between the first actuator bracket and the second actuator bracket;
   a second locking member for extending between the first actuator bracket and the second actuator bracket; and
   each actuator bracket having a two-step surface wherein opposite ends of the locking members engage opposite steps on opposite actuator brackets.

2. The slide interlock assembly recited in claim 1, wherein the first actuator includes a hole in a first one of the steps for receiving a first end of the second locking member when the second slide member is extended.

3. The slide interlock assembly recited in claim 2, wherein the second actuator includes a hole in a first one of the steps for receiving a second end of the first locking member when the first slide member is extended.

4. The slide interlock assembly recited in claim 2, further comprising a first spring for urging the first end of the second locking member into the hole in the first step of the first actuator bracket.

5. The slide interlock assembly recited in claim 3, further comprising a first spring for urging the first end of the second locking member into the hole in the first step of the first actuator bracket.

6. The slide interlock assembly recited in claim 5, further comprising a second spring for urging the second end of the first locking member into the hole in the first step of the second actuator bracket.

7. The slide interlock assembly recited in claim 1, further comprising a first mount bracket, secured to a stationary member of the rack, for guiding the first ends of the first and second locking members into engagement with the first actuator bracket.

8. The slide interlock assembly recited in claim 2, further comprising a first mount bracket, secured to a stationary member of the rack, for guiding the first ends of the first and second locking members into engagement with the first actuator bracket.

9. The slide interlock assembly recited in claim 3, further comprising a first mount bracket, secured to a stationary member of the rack, for guiding the first ends of the first and second locking members into engagement with the first actuator bracket.

10. The slide interlock assembly recited in claim 4, further comprising a first mount bracket, secured to a stationary member of the rack, for guiding the first ends of the first and second locking members into engagement with the first actuator bracket.

11. The slide interlock assembly recited in claim 5, further comprising a first mount bracket, secured to a stationary member of the rack, for guiding the first ends of the first and second locking members into engagement with the first actuator bracket.

12. The slide interlock assembly recited in claim 6, further comprising a first mount bracket, secured to a stationary member of the rack, for guiding the first ends of the first and second locking members into engagement with the first actuator bracket.

13. The slide interlock assembly recited in claim 12, wherein the first and second locking members include rods that are guided through holes in the mount bracket.

14. The slide interlock assembly recited in claim 1, wherein the first actuator bracket comprises a sloping surface, connecting the two steps thereof, for abutting a first end of the first locking member.

15. A slide interlock assembly recited in claim 14, wherein the second actuator bracket also comprises a sloping surface, connecting the two steps thereof, for abutting a second end of the second locking member.

16. A slide interlock assembly for a rack, comprising:
   a first rod;
   a first mount bracket, secured to a first stationary member of the rack, having a first guide for receiving one end of the rod;
   a second mount bracket, secured to a second stationary member of the rack, having a second guide for receiving a second end of the first rod;
   a first actuator bracket secured to a first slide member of the rack adjacent the first mount bracket, having a surface that is inclined relative to a sliding axis of the first slide member for engaging a first end of the first rod; and
   a second actuator bracket, secured to a second slide member of the rack, having a hole for receiving a second end of the first rod when the first slide member is extended.

17. The slide interlock assembly recited in claim 16, further comprising:
   a second rod;
   the second actuator bracket having a surface that is inclined relative to a sliding axis of the second slide member for engaging a second end of the second rod; and
   the first actuator bracket having a hole for receiving a first end of the second rod when the second slide member is extended.

18. The slide interlock assembly recited in claim 16, further comprising a spring for urging the second end of the first rod into the hole in the second actuator bracket.

19. The slide interlock assembly recited in claim 17, further comprising:
   a first spring for urging a second end of the first rod into the hole in the second actuator bracket; and
   a second spring for urging a first end of the first rod into the hole in the first actuator bracket.

20. The slide interlock assembly recited in claim 18, wherein the spring comprises a tension spring connected between the first rod and one of the first and second mount brackets.

21. The slide interlock assembly recited in claim 19, wherein
   the first spring comprises a tension spring connected between the first rod and the first mount bracket; and
   the second spring comprises another tension spring connected between the second rod and the second mount bracket.

22. A rack, comprising:
   first and second stationary members;
   first and second slide members arranged adjacent to the first and second stationary members, respectively;
   a first rod and a second rod extending between the first and second slide members;
   first means, secured to the first slide member, for moving the first rod upon retraction of the first slide member and for locking with the second rod upon extension of the second slide member;
   second means, secured to the second slide member, for moving the second rod upon retraction of the second slide member and for locking with the first rod upon extension of the first slide member.

23. The rack recited in claim 22 further comprising:
   third means for urging the first rod into engagement with the second means; and
   fourth means for urging the second rod into engagement with the first means.

24. The rack recited in claim 23 wherein the first means comprises a first actuator bracket, comprising:
   a surface that is inclined relative to a sliding axis of the first slide member for abutting a first end of the first rod; and
   a hole for receiving a first end of the second rod when the second slide member is extended.

25. The rack recited in claim 24, wherein the second means comprises a second actuator bracket, comprising:
   a surface that is inclined relative to a sliding axis of the second slide member for abutting the second end of the second rod; and
   a hole for receiving a second end of the first rod when the first slide member is in an extended position.

* * * * *